(12) United States Patent
Lee et al.

(10) Patent No.: US 11,392,230 B2
(45) Date of Patent: Jul. 19, 2022

(54) DISPLAY DEVICE

(71) Applicant: Samsung Display Co., Ltd., Yongin-Si (KR)

(72) Inventors: Minsu Lee, Yongin-si (KR); DeokHoi Kim, Seongnam-si (KR); Sungin Ro, Hwaseong-si (KR); Yongsung Park, Seoul (KR); Soomin Lee, Changwon-si (KR); Chang Yong Lee, Cheonan-si (KR); Soonmyung Hong, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/940,995

(22) Filed: Jul. 28, 2020

(65) Prior Publication Data

US 2021/0132720 A1    May 6, 2021

(30) Foreign Application Priority Data

Nov. 5, 2019   (KR) ........................ 10-2019-0140486

(51) Int. Cl.
*G09G 5/00*   (2006.01)
*G06F 3/041*   (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .... G06F 3/0412; G06F 3/0446; G06F 3/0443; G06F 3/0418; G06F 2203/04112;
(Continued)

(56) References Cited

U.S. PATENT DOCUMENTS 9,362,345 B2   6/2016  Jeong et al.
10,319,795 B2   6/2019  Chu et al.
(Continued)

FOREIGN PATENT DOCUMENTS

CN   109445638   3/2019
CN   111463238   7/2020
(Continued)

*Primary Examiner* — Jennifer T Nguyen
(74) *Attorney, Agent, or Firm* — F. Chau & Associates, LLC

(57) ABSTRACT

A display device includes: a substrate including a plurality of pixel areas and a non-pixel area at least partially surrounding each of the pixel areas; an element layer disposed on the substrate; a pixel defining film disposed on the element layer, wherein the pixel defining film includes first openings and a second opening, wherein the first openings overlap the plurality of pixel areas, and the second opening overlaps the non-pixel area and extends along the plurality of pixel areas; a plurality of light emitting elements disposed in the first openings; a sealing layer disposed on the element layer to cover the light emitting elements and the pixel defining film; and an input sensing part overlapping the second opening and disposed on the sealing layer.

18 Claims, 14 Drawing Sheets

(51) Int. Cl.
  *G06F 3/044* (2006.01)
  *H01L 27/32* (2006.01)
  *H01L 51/52* (2006.01)

(52) U.S. Cl.
  CPC ........ *H01L 27/323* (2013.01); *H01L 27/3246* (2013.01); *H01L 51/5253* (2013.01); *H01L 51/5284* (2013.01); *G06F 3/0418* (2013.01); *G06F 2203/04111* (2013.01); *G06F 2203/04112* (2013.01)

(58) Field of Classification Search
  CPC ......... G06F 2203/04111; H01L 27/323; H01L 51/5253; H01L 51/5284; H01L 27/3246
  USPC ......................................................... 345/174
  See application file for complete search history.

(56) References Cited

U.S. PATENT DOCUMENTS

| | | | | |
|---|---|---|---|---|
| 2014/0027731 A1* | 1/2014 | Kim | .................... | H01L 27/3246 257/40 |
| 2016/0260792 A1* | 9/2016 | Kim | .................... | H01L 27/3276 |
| 2018/0032188 A1* | 2/2018 | Park | ...................... | G06F 3/0446 |
| 2018/0233546 A1* | 8/2018 | Chu | ..................... | H01L 51/5203 |
| 2019/0088906 A1* | 3/2019 | Park | .................... | H01L 27/3206 |
| 2019/0123112 A1* | 4/2019 | Lee | ..................... | H01L 51/0097 |
| 2020/0235172 A1* | 7/2020 | Lee | ..................... | H01L 27/3246 |

FOREIGN PATENT DOCUMENTS

| | | |
|---|---|---|
| KR | 10-2014-0141529 | 12/2014 |
| KR | 10-2018-0094476 | 8/2018 |
| KR | 10-2020-0091059 | 7/2020 |

\* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2019-0140486, filed on Nov. 5, 2019, the disclosure of which is incorporated by reference herein in its entirety.

TECHNICAL FIELD

The present inventive concept relates to a display device, and more particularly, to a display device including an input sensing part.

DISCUSSION OF THE RELATED ART

Electronic devices such as smart phones, digital cameras, notebook computers, navigation devices, and smart televisions that provide images to a user include display devices for displaying the images. The display device generates an image and provides the image to a user through a display screen.

Generally, the display device includes a display panel for generating an image, and an input device such as a keyboard, a mouse, or an input sensing part. Typical input sensing parts are disposed on the display panel and detect a user's touch. The user's touch detected by the input sensing part is converted into an input signal. The display panel provides the user with an image corresponding to the input signal generated by the input sensing part.

The display panel typically includes a plurality of pixels for generating an image. The input sensing part includes a plurality of sensor parts for detecting a user's touch. Parasitic capacitors are formed between the sensor parts, which are conductors, and between the conductors of the pixels. Parasitic capacitors between the sensor parts affect the signal generated by the input sensing part, thereby generating noise in the generated signal. In this case, the touch sensitivity of the input sensing part may be impacted.

SUMMARY

According to an exemplary embodiment of the present inventive concept, a display device includes: a substrate including a plurality of pixel areas and a non-pixel area at least partially surrounding each of the pixel areas; an element layer disposed on the substrate; a pixel defining film disposed on the element layer, wherein the pixel defining film includes first openings and a second opening, wherein the first openings overlap the plurality of pixel areas, and the second opening overlaps the non-pixel area and extends along the plurality of pixel areas; a plurality of light emitting elements disposed in the first openings; a sealing layer disposed on the element layer to cover the light emitting elements and the pixel defining film; and an input sensing part overlapping the second opening and disposed on the sealing layer.

In an exemplary embodiment of the present inventive concept, the pixel areas are arranged in a first direction and a second direction crossing the first direction, wherein the second opening extends in the first direction and the second direction.

In an exemplary embodiment of the present inventive concept, the pixel defining film includes: a plurality of first pixel defining films separated from each other by the second opening and surrounding the pixel areas; and a plurality of protruding parts protruding from the plurality of first pixel defining films.

In an exemplary embodiment of the present inventive concept, the element layer includes: a plurality of transistors disposed on the non-pixel area; and an insulating layer disposed on the substrate to cover the transistors, wherein the light emitting elements are connected to the plurality of transistors through contact holes formed in the insulating layer.

In an exemplary embodiment of the present inventive concept, the plurality of protruding parts of the pixel defining film protrude toward the plurality of transistors.

In an exemplary embodiment of the present inventive concept, each of the light emitting elements includes: a first electrode disposed on the element layer and connected to a corresponding transistor, of the plurality of transistors, through a corresponding contact hole among the contact holes; a second electrode disposed on the first electrode; and a light emitting layer disposed between the first electrode and the second electrode.

In an exemplary embodiment of the present inventive concept, the first electrode includes: a first portion disposed in a corresponding first opening of the first openings; and a second portion extending from the first portion and overlapping a corresponding protruding part among the plurality of protruding parts of the pixel defining film.

In an exemplary embodiment of the present inventive concept, the corresponding protruding part is disposed on the element layer to cover the second portion of the first electrode.

In an exemplary embodiment of the present inventive concept, the second portion is connected to the corresponding transistor through the corresponding contact hole.

In an exemplary embodiment of the present inventive concept, the display device further includes a plurality of spacers disposed in predetermined portions of the second opening.

In an exemplary embodiment of the present inventive concept, the pixel defining film includes a plurality of second pixel defining films disposed between the spacers and the element layer and spaced apart from the plurality of first pixel defining films.

In an exemplary embodiment of the present inventive concept, a dielectric constant of an organic layer of the sealing layer is lower than that of the pixel defining film.

In an exemplary embodiment of the present inventive concept, the pixel defining film has a black color.

In an exemplary embodiment of the present inventive concept, the input sensing part includes: a plurality of first sensor parts having a mesh shape and arranged in a first direction; a plurality of first connection parts connecting the plurality of first sensor parts to each other; a plurality of second sensor parts having the mesh shape and arranged in a second direction crossing the first direction; and a plurality of second connection parts connecting the plurality of second sensor parts to each other, wherein the plurality of first sensor parts and the plurality of second sensor parts are alternately arranged and are spaced apart from each other, and the plurality of second sensor parts extend to cross the plurality of first sensor parts, wherein the plurality of second sensor parts is insulated from the plurality of first sensor parts.

In an exemplary embodiment of the present inventive concept, each of the first and second sensor parts includes: a plurality of first branch parts extending in a third direction crossing the first and second directions on the plane; and a plurality of second branch parts extending in a fourth direction crossing the third direction, wherein the mesh shape is formed by the plurality of first branch parts and the plurality of second branch parts.

In an exemplary embodiment of the present inventive concept, touch opening parts are formed by the plurality of first branch parts and the plurality of second branch parts and overlap the pixel areas, and the plurality of first branch parts and the plurality of second branch parts overlap the second opening.

According to an exemplary embodiment of the present inventive concept, a display device includes: a substrate including a plurality of pixel areas and a non-pixel area at least partially surrounding each of the pixel areas; an element layer disposed on the substrate; a plurality of first pixel defining films overlapping the non-pixel area and disposed on the element layer, wherein the plurality of first pixel defining films are separated from each other, and surround the pixel areas; a plurality of protruding parts protruding from the plurality of first pixel defining films; a plurality of light emitting elements disposed in first openings overlapping the pixel areas, wherein the first openings are formed in the first pixel defining films; a sealing layer disposed on the element layer to cover the plurality of light emitting elements and the plurality of first pixel defining films; and an input sensing part overlapping a second opening formed between the plurality of first pixel defining films and disposed on the sealing layer.

In an exemplary embodiment of the present inventive concept, the element layer includes a plurality of transistors disposed on the non-pixel area and connected to the light emitting elements, wherein each of the light emitting elements includes: a first electrode disposed on the element layer and connected to a corresponding transistor of the plurality of transistors; a second electrode disposed on the first electrode; and a light emitting layer disposed between the first electrode and the second electrode, wherein the protruding parts protrude toward the plurality of transistors.

In an exemplary embodiment of the present inventive concept, the first electrode includes: a first portion disposed in a corresponding first opening of the first openings; and a second portion extending from the first portion and overlapping a corresponding protruding part of the plurality of protruding parts, wherein the corresponding protruding part is disposed on the element layer to cover the second portion of the first electrode, and the second portion of the first electrode is connected to the corresponding transistor.

In an exemplary embodiment of the present inventive concept, the input sensing part includes a plurality of sensor parts, wherein each of the sensor parts includes: a plurality of first branch parts extending in a first direction; and a plurality of second branch parts extending in a second direction crossing the first direction, wherein the plurality of first branch parts and the plurality of second branch parts overlap the second opening.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
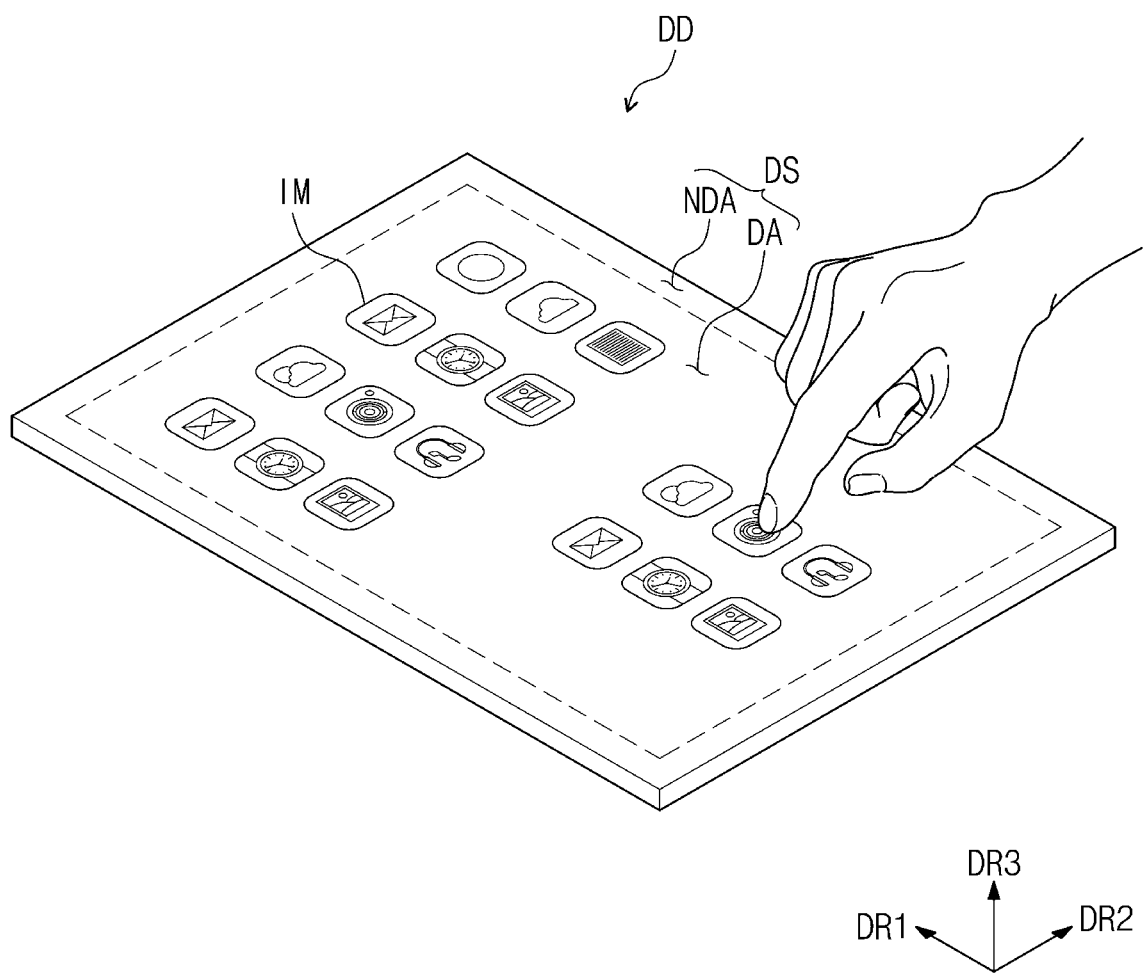
FIG. 1 is a perspective view of a display device according to an exemplary embodiment of the present inventive concept.

In this specification, it will be understood that when a component (or, an area, a layer, a part, etc.) is referred to as being "on", "connected to" or "combined to" another component, the component (or, an area, a layer, a part, etc.) may be directly on, connected to, or combined to the other component, or an intervening third component may also be present.

It is to be understood that like reference numerals may refer to like elements throughout the specification. Additionally, in the drawings, the thicknesses, proportions, and dimensions of components may be exaggerated for clarity.

The term "and/or" includes any and all combinations provided by related components.

It will be understood that the terms "first" and "second" may be used herein to describe various components but these components should not be limited by these terms. The above terms are used only to distinguish one component from another. For example, a first component may be referred to as a second component and vice versa without departing from the spirit and scope of the present inventive concept. The singular expressions include plural expressions unless referred to the contrary.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

Hereinafter, exemplary embodiments of the present inventive concept are described with reference to the accompanying drawings.

FIG. 1 is a perspective view of a display device according to an exemplary embodiment of the present inventive concept.

Referring to FIG. 1, a display device DD according to an exemplary embodiment of the present inventive concept may have a rectangular shape with long sides extending in the first direction DR1 and short sides extending in the second direction DR2 intersecting the first direction DR1. However, the present inventive concept is not limited thereto, and the display device DD may have various shapes such as a circular shape or a polygonal shape.

Hereinafter, the direction substantially perpendicular to the plane formed by the first direction DR1 and the second direction DR2 is referred to as the third direction DR3. Hereinafter, the meaning when viewed on a plane may refer to a state viewed from the third direction DR3.

An upper surface of the display device DD may be a display surface DS and may have a plane provided by the first direction DR1 and the second direction DR2. The images IM generated by the display device DD may be provided to the user through the display surface DS.

The display surface DS may include a display area DA and a non-display area NDA adjacent to the display area DA. The display area DA may display an image, and the non-display area NDA may not display an image. The non-display area NDA may at least partially surround the display area DA. For example, the non-display area NDA may completely surround the display area DA and may provide an outline portion of the display device DD printed in a predetermined color.

The display device DD may be used for relatively large electronic devices such as televisions, monitors, or external billboards. In addition, the display device DD may be used in relatively small and medium-sized electronic devices such as personal computers, notebook computers, personal digital terminals, car navigation systems, game machines, smartphones, tablets, or cameras. However, these are presented as exemplary embodiments only and the display device DD may be used for other electronic devices without departing from the spirit and scope of the present inventive concept.

Figure 2:
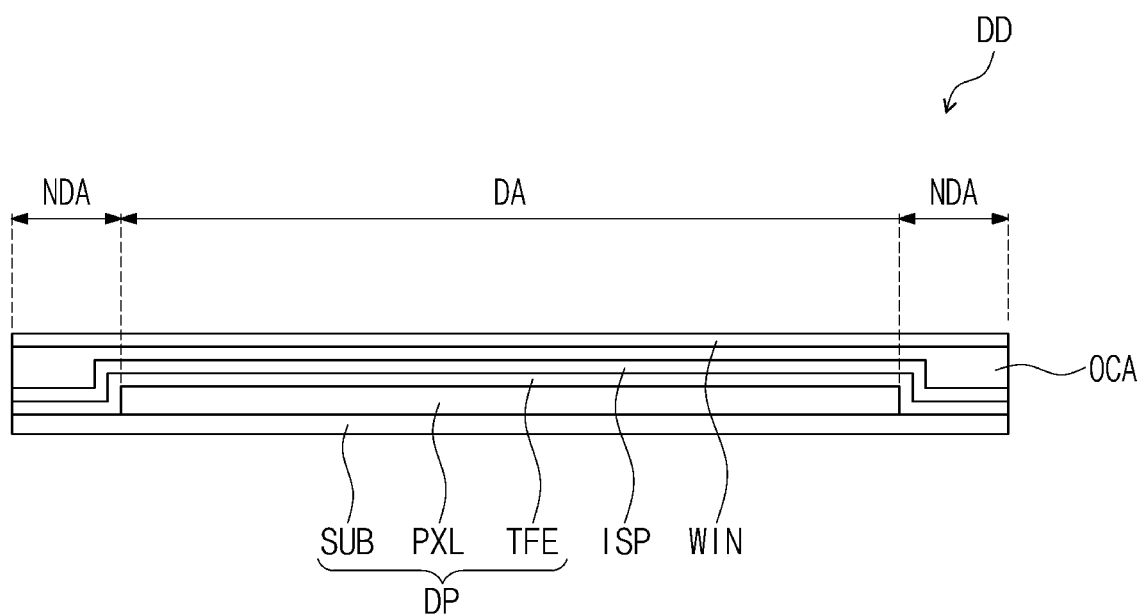
FIG. 2 is a schematic cross-sectional view of the display device illustrated in FIG. 1.

FIG. 2 is a schematic cross-sectional view of the display device illustrated in FIG. 1.

Referring to FIG. 2, a display device DD according to an exemplary embodiment of the present inventive concept may further include a display panel DP, an input sensing part ISP disposed on the display panel DP, a window WIN disposed on the input sensing part ISP, and an adhesive OCA disposed between the input sensing part ISP and the window WIN.

The display panel DP according to an exemplary embodiment of the present inventive concept may be a light emitting display panel, and the present inventive concept is not limited thereto. For example, the display panel DP may be an organic light emitting display panel or a quantum dot light emitting display panel. In the organic light emitting display panel, the light emitting layer may include an organic light emitting material. For example, the light emitting layer of the quantum dot light emitting display panel may include quantum dot, quantum rod, and the like. Hereinafter, the display panel DP is described as an organic light emitting display panel.

The display panel DP may include a substrate SUB, a pixel layer PXL disposed on the substrate SUB, and a thin film sealing layer TFE disposed on the substrate SUB to cover the pixel layer PXL. For example, the substrate SUB may include a flexible plastic substrate as a transparent substrate. For example, the substrate SUB may include polyimide (PI).

The substrate SUB may include a display area DA and a non-display area NDA adjacent to the display area DA, similar to, for example, the display surface DS of the display device DD. For example, the display area DA and the non-display area NDA of the substrate SUB may respectively correspond to the display area DA and the non-display area NDA of the display surface DS. The pixel layer PXL may be disposed on the display area DA. The pixel layer PXL may include a plurality of pixels, and each of the pixels may include a light emitting element.

The thin film sealing layer TFE may include at least two inorganic layers and an organic layer disposed between the inorganic layers. The inorganic layers may include an inorganic material and may protect the pixel layer PXL from moisture/oxygen. The organic layer may include an organic material and may protect the pixel layer PXL from foreign substances such as dust particles. For example, the thickness of the organic layer may be greater than the thickness of each of the inorganic layers.

The input sensing part ISP may detect an external input (e.g., a user's hand or a touch pen), change the detected external input to an input signal, and provide the input signal to the display panel DP. The input sensing part ISP may include a plurality of sensor parts for detecting an external input. The sensor parts can detect an external input in a capacitive manner. The display panel DP may receive an input signal, based on the detected external input, from the input sensing part ISP and generate an image corresponding to the input signal.

The window WIN may protect the display panel DP and the input sensing part ISP from external scratches and impacts. The window WIN may be attached to the input sensing part ISP by an adhesive OCA. For example, the adhesive OCA may include an optical clear adhesive. The image generated by the display panel DP may be provided to the user through the window WIN.

Figure 3:
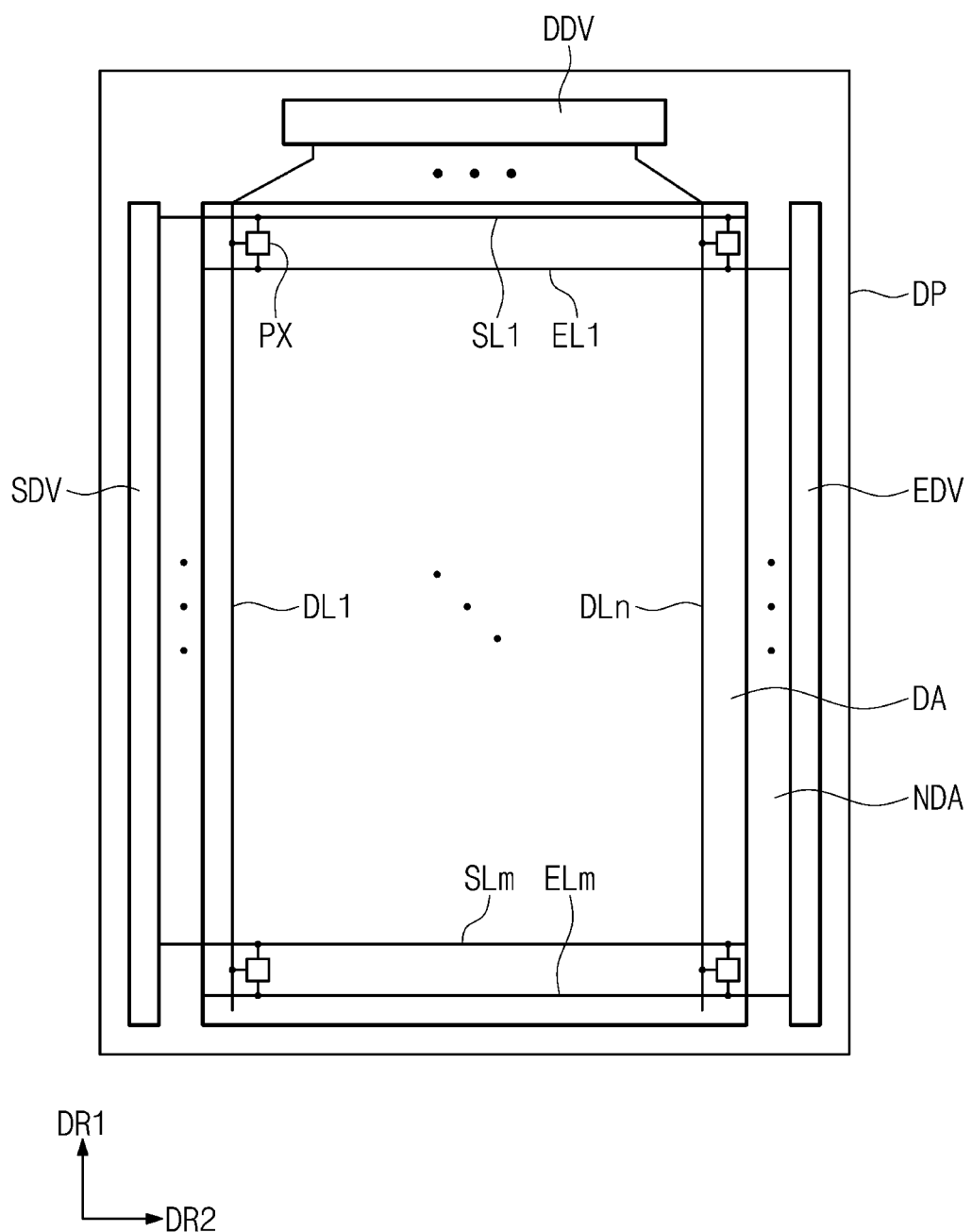
FIG. 3 is a plan view of the display panel shown in FIG. 2.

FIG. 3 is a plan view of the display panel shown in FIG. 2.

Referring to FIG. 3, a display device DD according to an exemplary embodiment of the present inventive concept may include a display panel DP, a scan driver SDV, a data driver DDV, and an emission driver EDV.

The display panel DP may be, for example, a flexible display panel. The display panel DP may have, for example, a rectangular shape having long sides extending in the first direction DR1 and short sides extending in the second direction DR2. The display panel DP may include a display area DA and a non-display area NDA at least partially surrounding the display area DA.

The display panel DP may include a plurality of pixels PX, a plurality of scan lines SL1 to SLm, a plurality of data lines DL1 to DLn, and a plurality of emission lines EL1 to ELm. m and n are natural numbers. The pixels PX may be disposed in the display area DA and may be connected to the scan lines SL1 to SLm, the data lines DL1 to DLn, and the emission lines EL1 to ELm.

The scan driver SDV, the data driver DDV, and the emission driver EDV may be disposed in the non-display area NDA. For example, the scan driver SDV and the emission driver EDV may be disposed adjacent to the long sides of the display panel DP, respectively. However, the present inventive concept is not limited thereto. For example, the scan driver SDV and the emission driver EDV may be disposed adjacent to the short sides of the display panel DP.

For example, the data driver DDV may be manufactured in the form of an integrated circuit chip and disposed adjacent to any one of the short sides of the display panel DP. However, the present inventive concept is not limited thereto, and the data driver DDV may be mounted on a flexible circuit board and connected to the display panel DP through the flexible circuit board connected to the display panel DP.

The scan lines SL1 to SLm may extend in the second direction DR2 and may be connected to the scan driver SDV. The data lines DL1 to DLn may extend in the first direction DR1 and may be connected to the data driver DDV. The emission lines EL1 to ELm may extend in the second direction DR2 and may be connected to the emission driver EDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn. The emission driver EDV generates a plurality of emission signals, and the emission signals may be applied to the pixels PX through the emission lines EL1 to ELm.

The display device DD may further include a timing controller for controlling operations of the scan driver SDV, the data driver DDV, and the emission driver EDV.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 4:
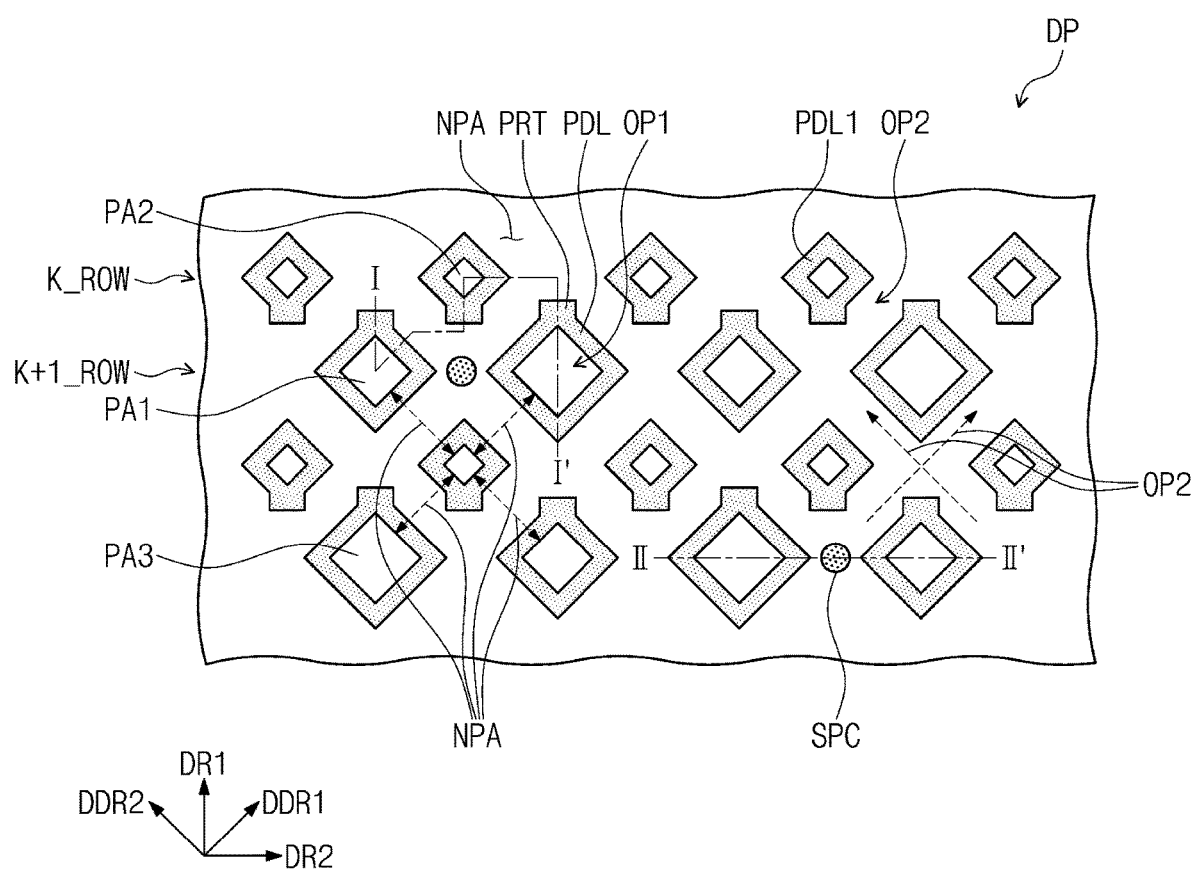
FIG. 4 is a diagram illustrating a portion of the display panel illustrated in FIG. 3.

FIG. 4 is a diagram illustrating a portion of the display panel illustrated in FIG. 3.

Referring to FIG. 4, in a plan view, the display panel DP may include a plurality of pixel areas PA1, PA2, and PA3 and a non-pixel area NPA around each of the pixel areas PA1, PA2, and PA3. The pixel areas PA1, PA2, and PA3 may be emission areas, and the non-pixel area NPA may be non-emission area.

Each of the pixels PX illustrated in FIG. 3 may include a transistor disposed in the non-pixel area NPA and a light emitting element disposed in each of the pixel areas PA1, PA2, and PA3. Such a configuration will be described in detail below with reference to FIG. 8.

The pixel areas PA1, PA2, and PA3 may display a predetermined color. For example, the pixel areas PA1, PA2, and PA3 may display red, green, and blue. However, the present inventive concept is not limited thereto, and the pixel areas PA1, PA2, and PA3 may generate white light by a combination of organic materials generating red, green, and blue.

The pixel areas PA1, PA2, and PA3 may have a rhombus shape, but the present inventive concept is not limited thereto, and the pixel areas PA1, PA2 and PA3 may have various shapes such as a circular shape and a polygonal shape. The pixel areas PA1, PA2, and PA3 may be arranged in the first diagonal direction DDR1 and the second diagonal direction DDR2.

The first diagonal direction DDR1 may be a direction intersecting the first and second directions DR1 and DR2 on a plane formed by the first and second directions DR1 and DR2. The second diagonal direction DDR2 may be a direction intersecting the first diagonal direction DDR1 on a plane provided by the first and second directions DR1 and DR2. For example, the first direction DR1 and the second direction DR2 may be substantially perpendicular to each other, and the first diagonal direction DDR1 and the second diagonal direction DDR2 may be substantially perpendicular to each other.

The pixel areas PA1, PA2, and PA3 may include a plurality of first pixel areas PA1, a plurality of second pixel areas PA2, and a plurality of third pixel areas PA3. For example, the first pixel areas PA1 may display red color. For example, the second pixel areas PA2 may display green. For example, the third pixel areas PA3 may display blue.

The pixel areas PA1, PA2, and PA3 may have different sizes according to colors that they are configured to display. For example, third pixel areas PA3 displaying blue may be larger than the first pixel areas PA1 displaying red, and the first pixel areas PA1 may be larger than the second pixel areas PA2 displaying green.

The display panel DP may include a pixel defining film PDL and a plurality of spacers SPC. For example, the pixel defining film PDL may have a black color. First opening parts OP1 (e.g., openings) overlapping the pixel areas PA1, PA2, and PA3 may be formed in the pixel defining film PDL. Substantially, the pixel areas PA1, PA2, and PA3 may be provided by the first opening parts OP1.

A second opening part OP2 (e.g., an opening) overlapping the non-pixel area NPA and extending along the pixel areas PA1, PA2, and PA3 may be provided in the pixel defining film PDL. The second opening part OP2 may extend in the first diagonal direction DDR1 and the second diagonal direction DDR2. In an exemplary embodiment of the present inventive concept, the second opening part OP2 may extend in the first direction DR1 and the second direction DR2.

The pixel defining film PDL may include a plurality of first pixel defining films PDL1 separated from each other by the second opening part OP2 and surrounding the pixel areas PA1, PA2, and PA3. In addition, the pixel defining film PDL may include a plurality of protruding parts PRT protruding from the first pixel defining films PDL. For example, each of the protruding parts PRT may protrude at one vertex or corner of each of the first pixel defining films PDL1.

The protruding parts PRT may protrude from the lower ends of the pixel areas disposed in the k-th row k_ROW and may protrude from the upper ends of the pixel areas disposed in the (k+1)-th row k+1_ROW. K may bean odd natural number. The protruding parts PRT may be arranged in the second direction DR2. In an exemplary embodiment of the present inventive concept, the protruding parts PRT may extend in the first direction DR.

Spacers SPC may be disposed in predetermined portions of the second opening part OP2. For example, the spacers SPC may have a circular shape, but the shape of the spacers SPC may not be limited thereto.

Figure 5:
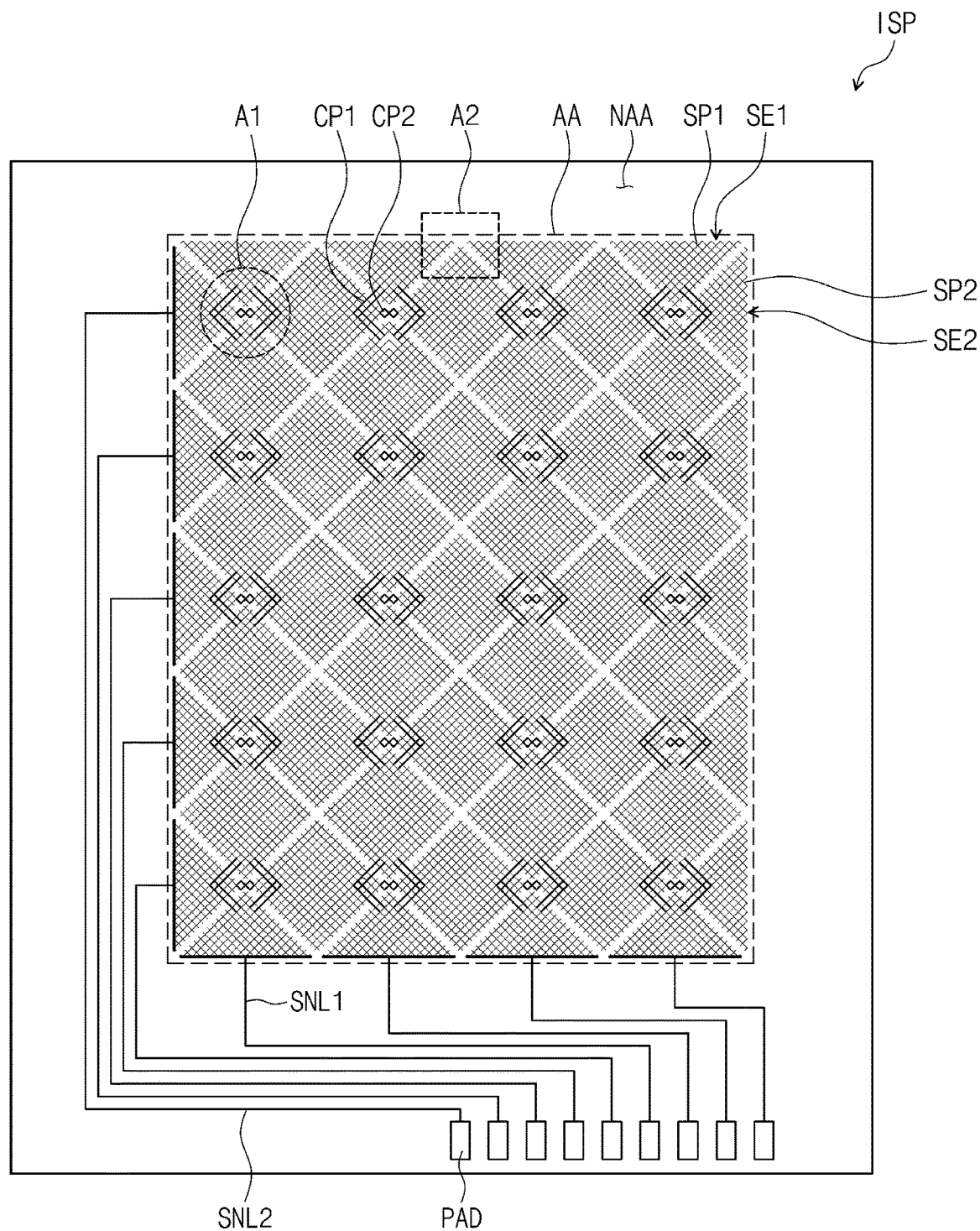
FIG. 5 is a plan view of an input sensing part illustrated in FIG. 2.

FIG. 5 is a plan view of the input sensing part illustrated in FIG. 2.

Referring to FIG. 5, the input sensing part ISP may include a plurality of detection electrodes SE1 and SE2, a plurality of wirings SNL1 and SNL2, and a plurality of pads PAD. The detection electrodes SE and SE2, the wirings SNL1 and SNL2, and the pads PAD may be disposed on the thin film sealing layer TFE.

The planar area of the input sensing part ISP may include an active area AA and an inactive area NAA surrounding the active area AA. The detection electrodes SE1 and SE2 may be disposed in the active area AA, and the pads PAD may be disposed in the inactive area NAA. The wirings SNL1 and SNL2 may be connected to the detection electrodes SE1 and SE2, and may extend from the detection electrodes SE1 and SE2 to the inactive area NAA and be connected to the pads PAD.

The pads PD may be connected to a driver for driving the input sensing part ISP through a flexible printed circuit board.

The detection electrodes SE1 and SE2 may include a plurality of first detection electrodes SE1 and a plurality of second detection electrodes SE2. The first detection electrodes SE1 extend in the first direction DR1 and are arranged in the second direction DR2. The plurality of second detection electrodes SE2 extend in the second direction DR2 and are arranged in the first direction DR1. The wirings SNL1 and SNL2 may include a plurality of first signal wirings SNL1 and a plurality of second signal wirings SNL2. The plurality of first signal wirings SNL1 may be connected to the first detection electrodes SE1. The plurality of second signal wirings SNL2 may be connected to the second detection electrodes SE2.

The second detection electrodes SE2 may extend to insulate and cross the first detection electrodes SE1. The first detection electrodes SE1 may be output detection electrodes, and the second detection electrodes SE2 may be input detection electrodes.

Each of the first detection electrodes SE1 may include a plurality of first sensor parts SP1 and a plurality of first connection parts CPL. The plurality of first sensor parts SP1 may be arranged in the first direction DR1, and the plurality of first connection parts CP1 may connect the first sensor parts SP1 to each other. Each of the first connection parts CP1 may be disposed between two first sensor parts SP1 adjacent to each other in the first direction DR1 to electrically connect the two first sensor parts SP1 to each other.

Each of the second detection electrodes SE2 may include a plurality of second sensor parts SP2 and a plurality of second connection parts CP2. The plurality of second sensor parts SP2 may be arranged in the second direction DR2, and a plurality of second connection parts CP2 may connect the second sensor parts SP2 to each other. Each of the second connection parts CP2 may be disposed between two second sensor parts SP2 adjacent to each other in the second direction DR2 to electrically connect the two second sensor parts SP2 to each other.

The first sensor parts SP1 and the second sensor parts SP2 may have a mesh shape. The first sensor parts SP1 and the second sensor parts SP2 may be spaced apart from each other without being overlapped with each other and alternately disposed. Capacitance may be formed by the first sensor parts SP1 and the second sensor parts SP2. The second connection parts CP2 may be insulated from and cross the first connection parts CP1.

For example, the first and second sensor parts SP1 and SP2 and the second connection parts CP2 may be disposed on the same layer. The first connection parts CP1 may be disposed on a different layer from that of the first and second sensor parts SP1 and SP2 and the second connection parts CP2. However, the present inventive concept is not limited thereto. For example, the second connection parts CP2 may be disposed on a different layer than that of the first and second sensor parts SP1 and SP2.

Each of the first signal wirings SNL1 may be connected to one end of each first detection electrode SE1, and each of the first signal wirings SNL1 may be connected to a pad of the plurality of pads PAD by extending into the inactive area NAA. Each of the second signal wirings SNL2 may be connected to one end of each second detection electrode SE2, and each of the second signal wirings SNL2 may be connected to a pad of the plurality of pads PAD by extending into the inactive area NAA.

The driver may operate each of the second detection electrodes SE2 as a driving electrode and operate each of the first detection electrodes SE1 as a sensing electrode. For example, the driver may apply a driving signal to each of the second detection electrodes SE2 through the second signal wirings SNL2 and receive a sensing signal from each of the first detection electrodes SE1 through the first signal wirings SNL1.

Figure 6:
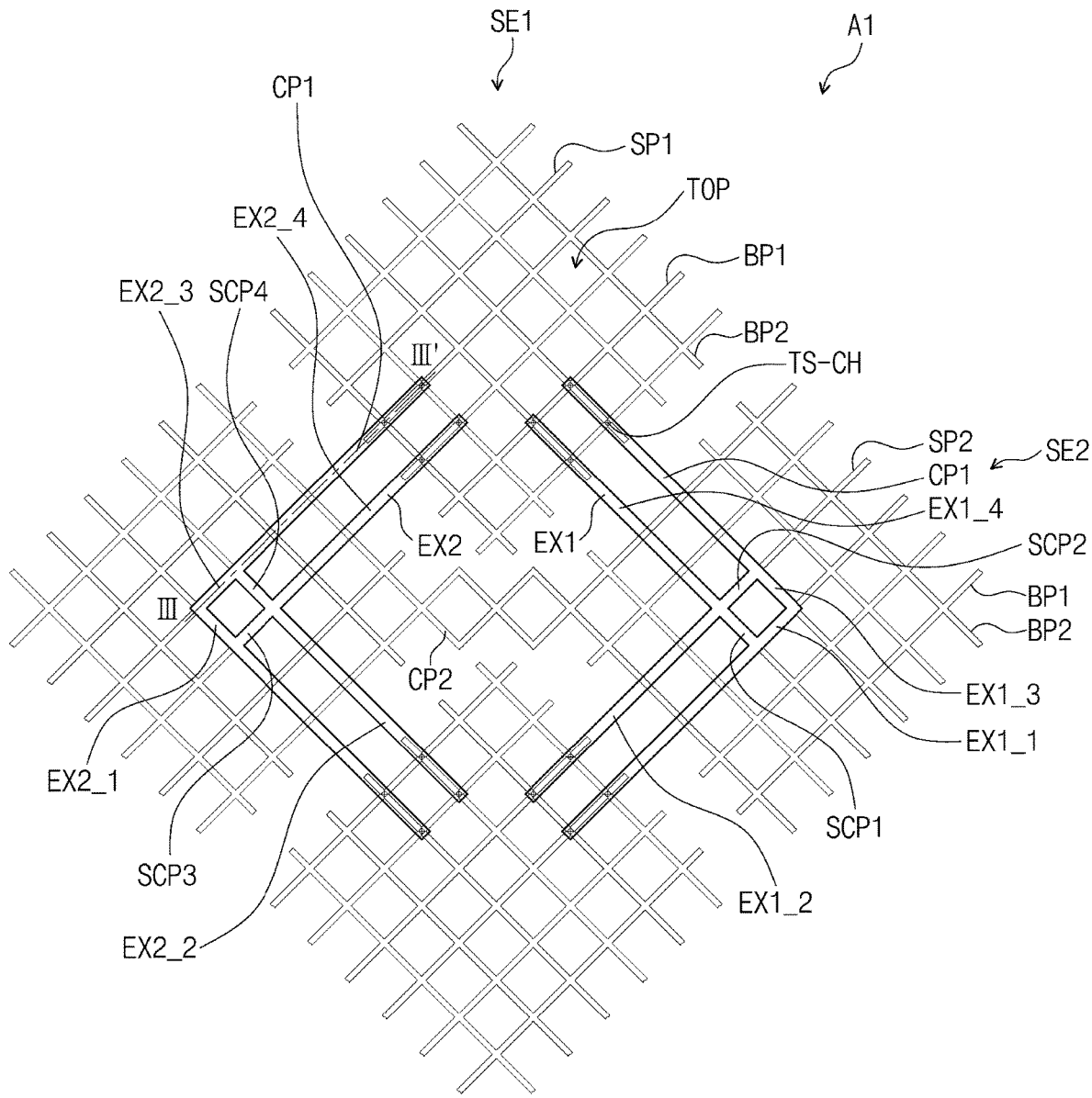
FIG. 6 is an enlarged view of a first area A1 shown in FIG. 5.
Figure 7:
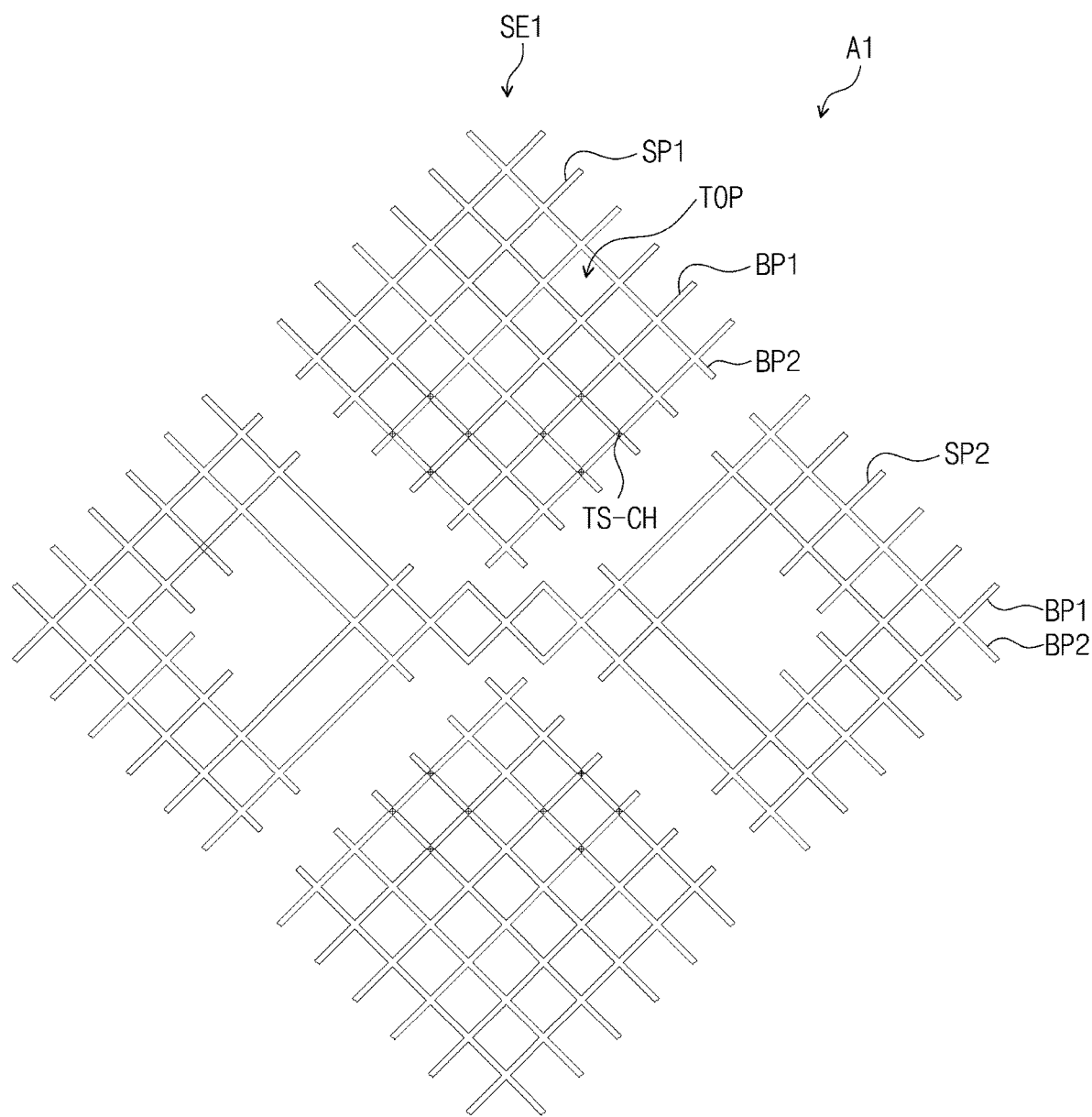
FIG. 7 is a view illustrating first and second sensor parts and a second connection part in FIG. 6.
Figure 7:
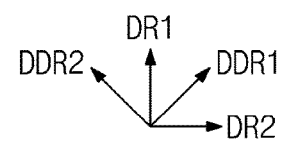
Figure 8:
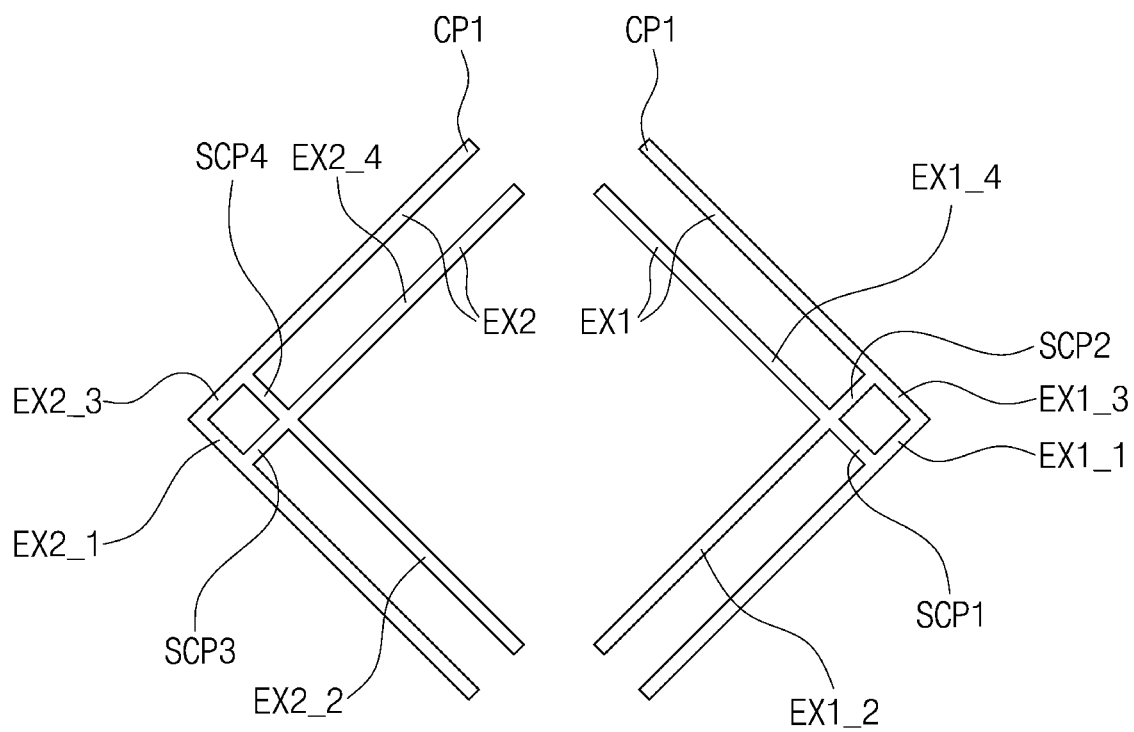
FIG. 8 is a view illustrating a first connection part in FG. 6.
Figure 8:
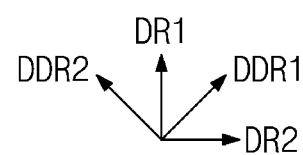

FIG. 6 is an enlarged view of the first area A1 shown in FIG. 5. FIG. 7 is a view illustrating only the first and second sensor parts and the second connection part in FIG. 6. FIG. 8 is a view illustrating only a first connection part in FIG. 6.

FIG. 6 illustrates two first sensor parts SP1 adjacent to each other and two second sensor parts SP2 adjacent to each other.

Referring to FIGS. 6, 7, and 8, the first and second sensor parts SP1 and SP2 may have a mesh shape. For example, each of the first and second sensor parts SP1 and SP2 may include a plurality of first branch parts BP1 extending in the first diagonal direction DDR1 and a plurality of second branch parts BP2 extending in the second diagonal direction DDR2.

In each of the first and second sensor parts SP1 and SP2, the first branch parts BP1 may cross the second branch parts BP2 and may be integrally formed with each other. The mesh shape may be formed by the first branch parts BP1 and the second branch parts BP2 that cross each other. In addition, the rhombic touch opening parts TOP may be formed by the first branch parts BP1 and the second branch parts BP2. The first and second branch parts BP1 and BP2 may be formed by mesh lines, and, for example, the line width of each of the mesh lines may be several micrometers.

The first connection part CP1 may extend so as not to overlap with the second connection part CP2 and may electrically connect two first sensor parts SP1 adjacent to each other. The first connection part CP1 may not be integrally formed with the first sensor parts SP1. The first connection part CP1 may be connected to the first sensor parts SP1 through the plurality of contact holes TS-CH. The first connection part CP1 may extend toward the first sensor parts SP1 through a predetermined area of each of the second sensor parts SP2 adjacent to the second connection part CP2.

The second connection part CP2 may electrically connect two second sensor parts SP2 adjacent to each other. The second sensor parts SP2 and the second connection part CP2 may be integrally formed. The second connection part CP2 has a mesh shape and may extend from the second sensor parts SP2 that are adjacent to each other. The second connection part CP2, the first sensor parts SP1, and the second sensor parts SP2 may be simultaneously patterned with the same material.

The first connection part CP1 may include a first extension part EX1 and a second extension part EX2 having a shape symmetrical with the first extension part EX1 with respect to a line extending in the first direction DR1 between the first extension part EX1 and the second extension part EX2. The first expansion part EX1 and the second expansion part EX2 may not overlap the second connection part CP2. The second connection part CP2 may be disposed between the first expansion part EX1 and the second expansion part EX2.

The first expansion part EX1 may extend through the second sensor part SP2 of the second sensor parts SP2 and may be connected to the first sensor parts SP1 that are adjacent to each other. The second expansion part EX2 may extend through another second sensor part SP2 of the second sensor parts SP2 and may be connected to the first sensor parts SP1 that are adjacent to each other. For example, the second sensor part SP2 and the other second sensor part SP2 may be adjacent to each other and may be connected to each other through the second connection part CP2.

Hereinafter, in FIGS. 6 and 7, the first sensor parts SP1 may be referred to as the upper first sensor part SP1 and the lower first sensor part SP1 according to a relative arrangement position. In addition, the second sensor parts SP2 may be referred to as a left second sensor part SP2 and a right second sensor part SP2 according to a relative arrangement position.

A predetermined area of the first expansion part EX1 adjacent to one side of the first expansion part EX1 may be connected to the lower first sensor part SP1 through the plurality of contact holes TS-CH. A predetermined area of the first expansion part EX adjacent to the other side of the first expansion part EX1 may be connected to the upper first sensor part SP1 through the plurality of contact holes TS-CH. The contact holes TS-CH may be formed in an insulating layer disposed on the first connection part CP1, and the structure of the contact holes TS-CH will be shown in FIG. 12 below.

A predetermined area of the second expansion part EX2 adjacent to one side of the second expansion part EX2 may be connected to the lower first sensor part SP1 through the plurality of contact holes TS-CH. A predetermined area of the second expansion part EX2 adjacent to the other side of the second expansion part EX2 may be connected to the upper first sensor part SP1 through the plurality of contact holes TS-CH. The first expansion part EX1 may extend through the right second sensor part SP2. The second expansion part EX2 may extend through the left second sensor part SP2.

The first expansion part EX1 may include a first sub expansion part EX1_1 and a second sub expansion part EX1_2 extending in the first diagonal direction DDR1, a third sub expansion part EX1_3 and a fourth sub expansion part EX1_4 extending in the second diagonal direction DDR2, a first sub connection part SCP1 extending in the second diagonal direction DDR2, and a second sub connection part SCP2 extending in the first diagonal direction DDR1. The second sub expansion part EX1_2 has a length smaller than that of the first sub expansion part EX1_1, and the fourth sub expansion part EX_4 may have a length smaller than that of the third sub expansion part EX1_3.

A predetermined area of the first sub expansion part EX1_1 adjacent to one side of the first sub expansion part EX1_1 may be connected to the lower first sensor part SP1 through the plurality of contact holes TS-CH. A predetermined area of the second sub expansion part EX1_2 adjacent to one side of the second sub expansion part EX1_2 may be connected to the lower first sensor part SP1 through the plurality of contact holes TS-CH. For example, the first sub expansion part EX1_1 and the second sub expansion part EX1_2 are connected to the lower first sensor part SP1 through two contact holes TS-CH, respectively, but the number of contact holes TS-CH may not be limited thereto.

A predetermined area of the third sub expansion part EX1_3 adjacent to one side of the third sub expansion part EX1_3 may be connected to the upper first sensor part SP1 through the plurality of contact holes TS-CH. A predetermined area of the fourth sub expansion part EX1_4 adjacent to one side of the fourth sub expansion part EX1_4 may be connected to the upper first sensor part SP1 through the plurality of contact holes TS-CH. For example, the third sub expansion part EX_3 and the fourth sub expansion part EX_4 are connected to the upper first sensor part SP1 through two contact holes TS-CH, respectively, but the number of contact holes CH may not be limited thereto.

The other side of the first sub expansion part EX1_1 may be connected to the other side of the third sub expansion part EX1_3, and the other side of the second sub expansion part EX1_2 may be connected to the other side of the fourth sub expansion part EX1_4. The first sub connection part SCP1 may extend from the other side of the fourth sub expansion part EX1_4 in the second diagonal direction DDR2 and may be connected to the first sub expansion part EX1_1. The second sub connection part SCP2 may extend from the other side of the second sub expansion part EX1_2 in the first diagonal direction DDR1 and may be connected to the third sub expansion part EX1_3.

For example, the first sub expansion part EX1_1, the second sub expansion part EX1_2, the third sub expansion part EX1_3, the fourth sub expansion part EX1_4, the first sub connection part SCP1, and the second sub connection part SCP2 may be integrally formed.

The first and second sub expansion parts EX1_1 and EX1_2 may extend to intersect a predetermined number of second branch parts BP2 among the second branch parts BP2 of the right second sensor part SP2. For example, the second branch parts BP2 may be adjacent to the lower first sensor SP1. For example, in FIG. 6, two second branch parts BP2 intersect the first and second sub expansion parts EX1_1 and EX1_2 but the number of intersecting second branch parts BP2 is not limited thereto. The first branch parts BP1 of the right second sensor part SP2 may not be disposed in an area overlapping the first and second sub expansion parts EX1_1 and EX1_2 and the second sub connection part SCP2.

The third and fourth sub expansion parts EX1_3 and EX1_4 may extend to intersect a predetermined number of first branch parts BP1 among the first branch parts BP1 of the right second sensor part SP2. For example, the first branch parts BP1 may be adjacent to the upper first sensor part SP1. For example, in FIG. 6, two first branch parts BP1 intersect the third and fourth sub expansion parts EX1_3 and EX1_4, but the number of intersecting first branch parts BP1 is not limited thereto. For example, the second branch parts BP2 of the right second sensor part SP2 may not be disposed in an area overlapping the third and fourth sub expansion parts EX1_3 and EX1_4 and the first sub connection part SCP1.

The second expansion part EX2 may include a fifth sub expansion part EX2_1 and a sixth sub expansion part EX2_2 extending in the second diagonal direction DDR2, a seventh sub expansion part EX2_3 and an eighth sub expansion pan EX2_4 extending in the first diagonal direction DDR1, a third sub connection part SCP3 extending in the first diagonal direction DDR1, and a fourth sub connection part SCP4 extending in the second diagonal direction DDR2.

Since the second expansion part EX2 has a structure symmetrical with the first expansion part EX1, the fifth to eighth sub expansion parts EX2_1 to EX2_4 and the third and fourth sub connection parts SCP3 and SCP4 may have a structure that is symmetrical to the first to fourth sub expansion parts EX1_1 to EX1_4 and the first and second sub connection parts SCP1 and SCP2, respectively, with respect to a line extending in the first direction DR1 between the first extension part EX1 and the second extension part EX2. Accordingly, a predetermined area of each of the fifth to eighth sub expansion parts EX2_1 to EX2_4 adjacent to one side of each of the fifth to eighth sub expansion parts EX2_1 to EX2_4 may be connected to the first sensor parts SP1 through the plurality of contact holes TS-CH.

In the same manner as the first to fourth sub expansion parts EX1_1 to EX1_4 connect the first sensor parts SP1 through the right second sensor part SP2, the fifth to eighth sub expansion parts EX2_1 to EX2_4 may connect the first sensor parts SP1 through the left second sensor part SP2. The first and second branch parts BP1 and BP2 of the left second sensor part SP2 may not be disposed in an area overlapping the fifth to eighth sub expansion parts EX2_1 to EX2_4 and the third and fourth sub connection parts SCP3 and SCP4. Since the second expansion part EX2 has a structure symmetrical with the first expansion part EX1, a more detailed description of the second expansion part EX2 may be omitted.

Figure 9:
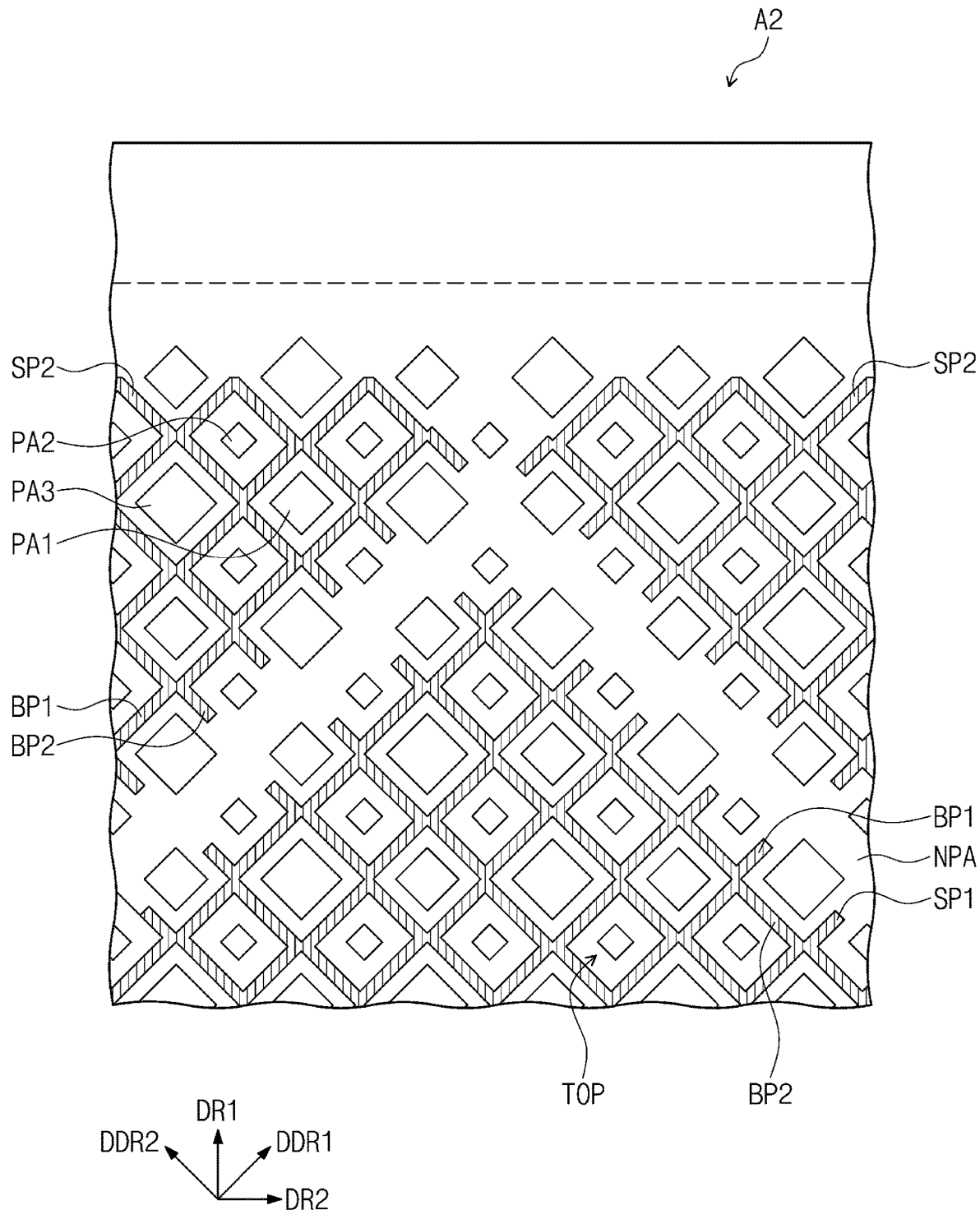
FIG. 9 is an enlarged view of a second area A2 shown in FIG. 5.

FIG. 9 is an enlarged view of the second area A2 shown in FIG. 5.

For convenience of description, the pixel areas PA1, PA2, and PA3 are shown together with the first and second sensor parts SP1 and SP2.

Referring to FIG. 9, the first and second sensor parts SP1 and SP2 may overlap the non-pixel area NPA. For example, the first and second branch parts BP1 and BP2 may overlap the non-pixel area NPA.

The touch opening parts TOP may overlap the pixel areas PA1, PA2, and PA3. The touch opening parts TOP may have a shape corresponding to the shapes of the pixel areas PA1, PA2, and PA3, and may have sizes corresponding to the pixel areas PA1, PA2, and PA3. For example, the touch opening parts TOP may have a rhombus shape. However, the present inventive concept is not limited thereto, and for example, the touch opening parts TOP may have a polygonal shape or a circular shape.

Since the first and second sensor parts SP1 and SP2 are disposed in the non-pixel area NPA, light generated in the pixel areas PA1, PA2, and PA3 may be normally emitted without being affected by the first and second sensor parts SP1 and SP2.

Figure 10:
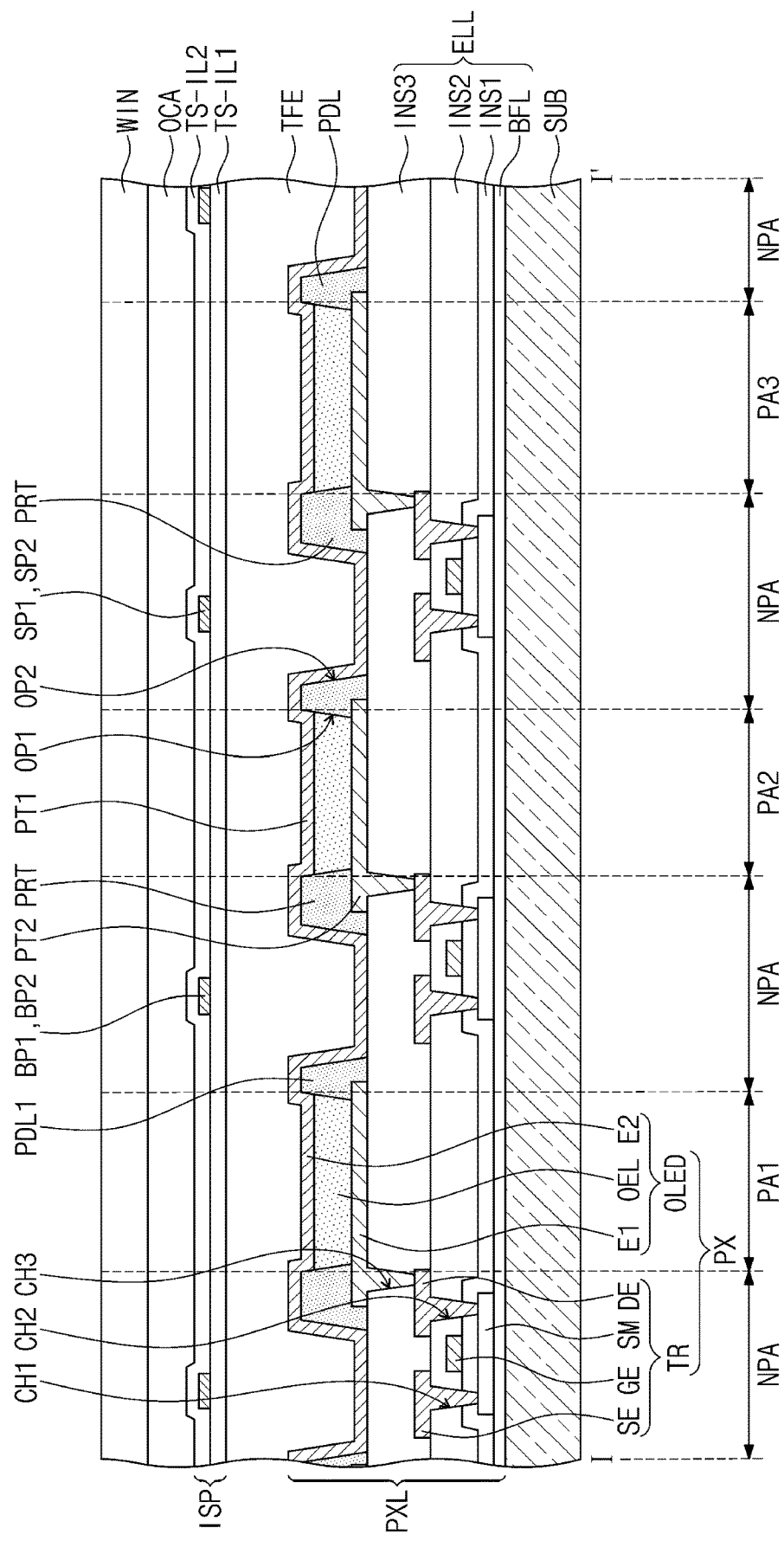
FIG. 10 is a cross-sectional view taken along line I-I' of FIG. 4.
Figure 11:
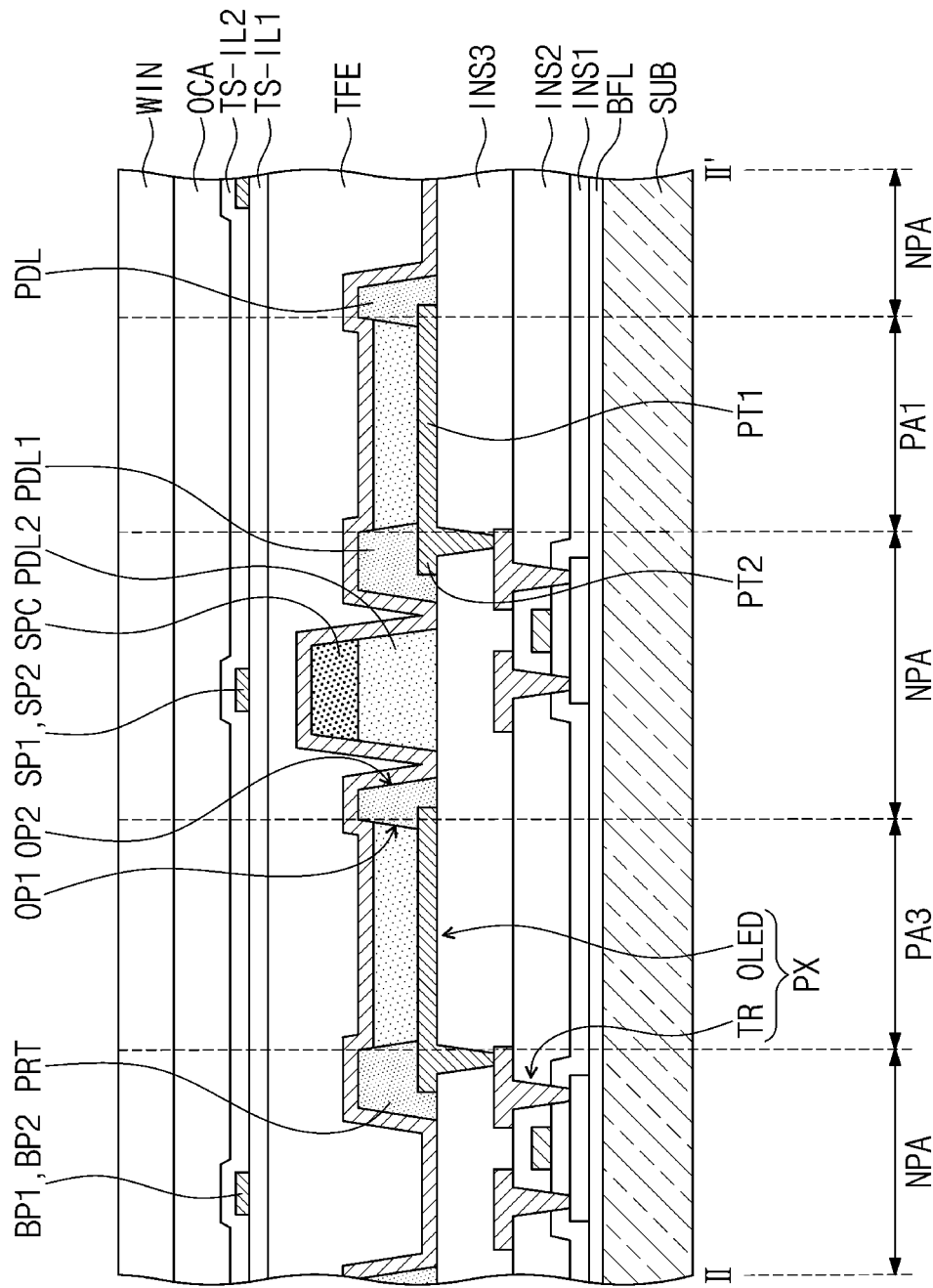
FIG. 11 is a cross-sectional view taken along line II-II' of FIG. 4.

FIG. 10 is a cross-sectional view taken along line I-I' of FIG. 4. FIG. 11 is a cross-sectional view taken along line II-II' of FIG. 4.

FIGS. 10 and 11 are cross-sectional views of the input sensing part ISP and the window WIN. FIG. 4 will be described with reference to FIGS. 10 and 11 according to the description below.

Referring to FIGS. 4 and 10, the pixels PX may include transistors TR and light emitting elements OLED connected to the transistors TR. The light emitting elements OLED may be an organic light emitting element. The transistors TR and the light emitting elements OLED may be disposed on the substrate SUB.

The substrate SUB may include a plurality of first, second, and third pixel areas PA1, PA2, and PA3 and a non-pixel area NPA around each of the first, second, and third pixel areas PA1, PA2, and PA3. The transistors TR may be disposed on the non-pixel area NPA, and the light emitting elements OLED may be disposed on the first, second, and third pixel areas PA1, PA2, and PA3, respectively. The light emitting elements OLED may be disposed in the first opening parts OP1.

Since the configurations of the pixels PX are substantially the same, hereinafter, the configuration of the pixel PX including the light emitting element OLED disposed in the first pixel area PA1 will be described.

The light emitting element OLED may include a first electrode E1, a second electrode E2, and a light emitting layer OEL disposed between the first electrode E1 and the second electrode E2. The light emitting layer OEL may be an organic light emitting layer. The first electrode E1 may be an anode electrode, and the second electrode E2 may be a cathode electrode. The first electrode E1 may be a pixel electrode, and the second electrode E2 may be a common electrode.

The transistor TR and the light emitting element OLED may be disposed on the substrate SUB. The buffer layer BFL is disposed on the substrate SUB, and the buffer layer BFL may include an inorganic material.

The semiconductor layer SM of the transistor TR may be disposed on the buffer layer BFL. The semiconductor layer SM may include a semiconductor material of an inorganic material such as amorphous silicon or poly silicon, or an organic semiconductor material. Additionally, the semiconductor layer SM may include an oxide semiconductor. The semiconductor layer SM may include a source area, a drain area, and a channel area between the source area and the drain area.

The first insulating layer INS1 may be disposed on the buffer layer BFL to cover the semiconductor layer SM. The first insulating layer INS1 may include an inorganic material. The gate electrode GE of the transistor TR overlapping the semiconductor layer SM may be disposed on the first insulating layer INS1. The gate electrode GE may be disposed to overlap the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be spaced from each other and disposed on the second insulating layer INS2. The source electrode SE may be connected to the source area of the semiconductor layer SM through a first contact hole H1 that is formed in the first insulating layer INS and the second insulating layer INS2. The drain electrode DE may be connected to the drain area of the semiconductor layer SM through a second contact hole H2 that is formed in the first insulating layer INS1 and the second insulating layer INS2.

The third insulating layer INS3 may be disposed on the second insulating layer INS2 to cover the source electrode SE and the drain electrode DE of the transistor TR. The third insulating layer INS3 may be a planarization film that provides a flat upper surface, and may include organic materials. The layer including the buffer layer BFL, first insulating layer INS1, the second insulating layer INS2 and the third insulating layer INS3 may be an element layer ELL on which the transistors TR are disposed.

The pixel defining film PDL and the light emitting elements OLED may be disposed on the element layer ELL. For example, the first electrode E1 may be disposed on the third insulating layer INS3. The first electrode E1 may be connected to the drain electrode DE of the transistor TR through a third contact hole CH3 penetrating through the third insulating layer INS3.

The pixel defining film PDL exposing a predetermined portion of the first electrode E1 may be disposed on the first electrode E1 and the third insulating layer INS3. The pixel defining film PDL may overlap the non-pixel area NPA. A first opening part OPt overlapping the first pixel area PA1 to expose the predetermined portion of the first electrode E1 may be formed in the pixel defining film PDL. In addition, as described above, a second opening part OP2 overlapping the non-pixel area NPA may be formed in the pixel defining film PDL.

The first electrode E1 may include a first portion PT1 disposed in the first opening part OP1 and a second portion PT2 extending from the first portion PT1 and overlapping the protruding part PRT. The second portion PT2 may be connected to the transistor TR through the third contact hole CH3. The protruding part PRT may be disposed on the element layer ELL to cover the second portion PT2. In addition, the protruding part PRT may protrude toward the transistor TR.

The light emitting layer OEL may be disposed on the first electrode E1 in the first opening part OP1. The light emitting layer OEL may generate light of red, green, or blue. However, the present inventive concept is not limited thereto and the light emitting layer OEL may generate white light by a combination of organic materials generating red, green, and blue.

The second electrode E2 may be disposed on the pixel defining film PDL and the light emitting layer OEL. The second electrode E2 may be disposed on the element layer ELL in the second opening part OP2 to contact the element layer ELL. The thin film sealing layer TFE may be disposed on the element layer ELL to cover the light emitting element OLED and the pixel defining film PDL.

The dielectric constant of the thin film sealing layer TFE may be lower than that of the pixel defining film PDL. The layer between the substrate SUB and the thin film sealing layer TFE may be a pixel layer PXL.

The first voltage may be applied to the first electrode E1, and the second voltage having a level lower than the first voltage may be applied to the second electrode E2. For example, an exciton is formed as holes and electrons that are injected to the light emitting layer OEL are combined, and the light emitting element (OLED) may emit light as the excitons transition to the ground state. The light emitting element OLED emits red, green, and blue light according to the flow of current, thereby displaying an image.

The input sensing part ISP may be disposed on the thin film sealing layer TFE. The first and second sensor parts SP1 and SP2 of the input sensing part ISP may overlap the second opening part OP2 formed in the non-pixel area NPA. For example, the first and second branch parts BP1 and BP2 of the first and second sensor parts SP1 and SP2 may overlap the second opening part OP2.

The adhesive OCA may be disposed on the input sensing part ISP, and the window WIN may be disposed on the adhesive OCA.

Referring to FIGS. 4 and 11, a spacer SPC may be disposed on a portion of the second opening part OP2. The pixel defining film PDL may include a second pixel defining film PDL2 disposed between the spacer SPC and the element layer ELL. The second pixel defining film PDL2 may be formed substantially at the same time as the first pixel defining film PDL1. The second pixel defining film PDL2 may be spaced apart from the first pixel defining film PDL1.

For example, the spacer SPC may include an organic material. The spacer can be monolayer or multilayer. For example, the spacer SPC may be separately disposed on the second pixel defining film PDL2, but the present inventive concept is not limited thereto. For example, the spacer SPC may be integrally formed with the second pixel defining film PDL2. For example, the spacer SPC may be formed to protrude upward from an upper surface of the second pixel defining film PDL2. The spacer SPC may firmly bond the substrate SUB to the thin film sealing layer TFE.

Figure 12:
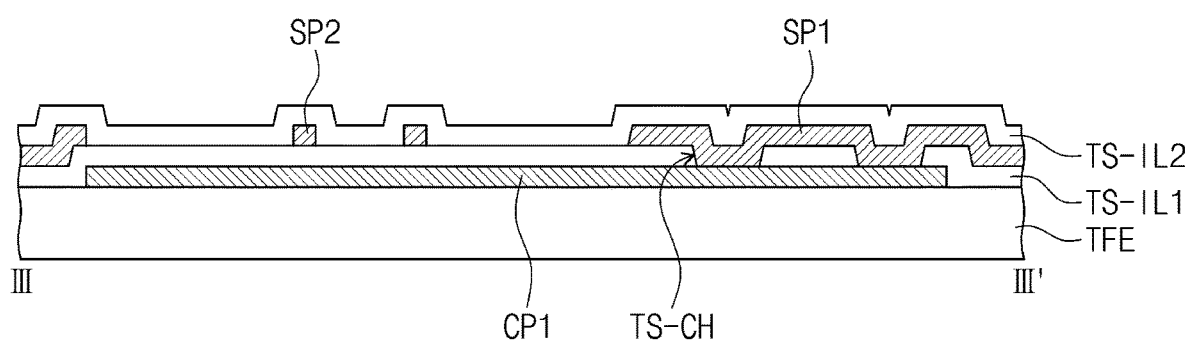
FIG. 12 is a cross-sectional view taken along line III-III' of FIG. 6.

FIG. 12 is a cross-sectional view taken along line III-III' of FIG. 6.

Referring to FIG. 11, a first connection part CP1 may be disposed on the thin film sealing layer TFE. An inorganic insulating layer may be further disposed on the thin film sealing layer TFE, and a first connection part CP1 may be disposed on the inorganic insulating layer.

The first insulating layer TS-IL1 may be disposed on the thin film sealing layer TFE to cover the first connection part CP1. First sensor parts SP1 and second sensor parts SP2 may be disposed on the first insulating layer TS-IL1. The second connection part CP2 integrally formed with the second sensor parts SP2 may also be disposed on the first insulating layer TS-IL1. The second insulating layer TS-L2 may be disposed on the first insulating layer TS-IL1 to cover the first sensor parts SP1 and the second sensor parts SP2.

The first connection part CP1 may be connected to the first sensor parts SP1 through the plurality of contact holes TS-CH formed in the first insulating layer TS-IL1.

Figure 13:
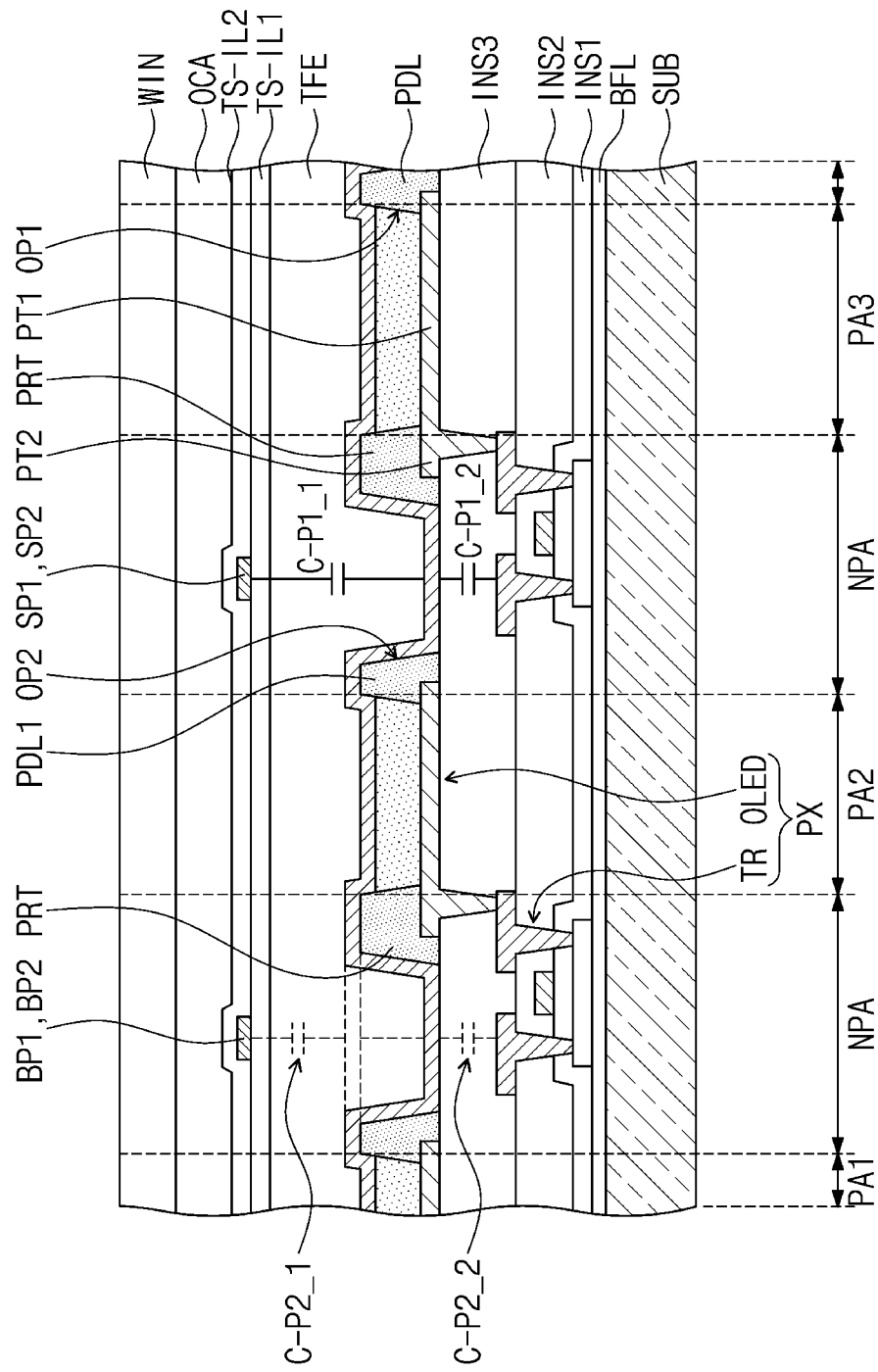
FIG. 13 is a cross-sectional view of some pixels among pixels illustrated in FIG. 10.

FIG. 13 is a cross-sectional view of some pixels among the pixels illustrated in FIG. 10.

Referring to FIG. 13, a parasitic capacitor C-P1_1 may be formed by the first and second sensor parts SP1 and SP2 and the second electrode E2 in the non-pixel area NPA. In addition, a parasitic capacitor C-P1_2 may be formed between the second electrode E2 and the transistor TR.

The capacitance of the capacitor may be inversely proportional to the distance between the two conductors forming the capacitor, and may be proportional to the dielectric constant of the insulating layer disposed between the conductors.

In an exemplary embodiment of the present inventive concept, the pixel defining film PDL is not disposed in the second opening part OP2. A thin film sealing layer TFE including an organic layer having a dielectric constant smaller than that of the pixel defining film PDL may be disposed in the second opening part OP2.

As illustrated by a dotted line in FIG. 13, the pixel defining film PDL may be disposed in the entire non-pixel area NPA, so that the second opening part OP2 may not be formed. In this case, the distance between the first and second sensor parts SP1 and SP2 and the second electrode E2 may be closer. Accordingly, the parasitic capacitor C-P2_1 having a larger capacitance than the parasitic capacitor C-P1_1 may be formed by the first and second sensor parts SP1 and SP2 and the second electrode E2.

In addition, since the pixel defining film PDL has a higher dielectric constant than the organic layer of the thin film sealing layer TFE, the parasitic capacitor C-P2_2 with a capacitance larger than that of the parasitic capacitor C-P1_2 may be formed by the second electrode E2 and the transistor TR. Since the inorganic layers of the thin film sealing layer TFE have a smaller thickness than the organic layer, the influence of the dielectric constant of the inorganic layers on the capacitance of the parasitic capacitor may be small.

However, in the exemplary embodiment of the present inventive concept, since the pixel defining film PDL is not disposed in the second opening part OP2, the distances between the first and second sensor parts SP1 and SP2 and the second electrode E2 may be further spaced apart. Therefore, the parasitic capacitor C-P1_1 having a capacitance smaller than that of the parasitic capacitor C-P2_1 may be formed. In addition, since a thin film sealing layer TFE including an organic layer having a dielectric constant smaller than that of the pixel defining film PDL is disposed in the second opening part OP2, a parasitic capacitor C-P1_2 having a capacitance smaller than that of the parasitic capacitor C-P2_2 may be formed.

As the capacitance of the parasitic capacitors increases, the touch sensitivity of the first and second sensor parts SP1 and SP2 may decrease due to the influence of the parasitic capacitors.

Figure 14:
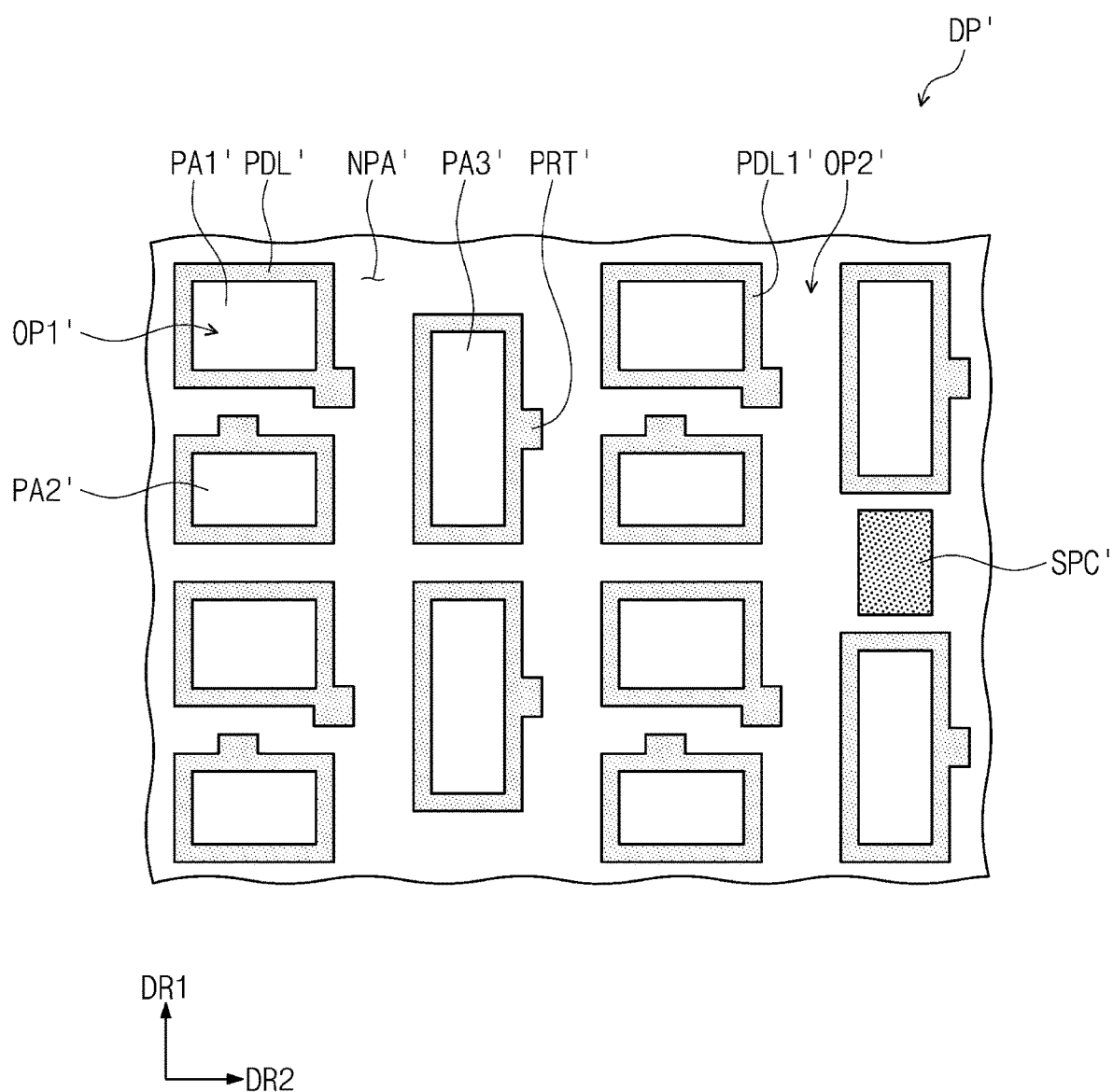
FIG. 14 is a view illustrating a portion of a display panel of a display device according to an exemplary embodiment of the present inventive concept.

As a result, the display device according to an exemplary embodiment of the present inventive concept may increase the touch sensitivity of the input sensing part ISP by reducing the capacitance of the parasitic capacitors C-P1_1 and C-P1_2 between the first and second sensor parts SP1 and SP2 and the pixels PX, FIG. 14 is a view illustrating a portion of a display panel of a display device according to exemplary embodiment of the present inventive concept.

Except for the shape and arrangement of the pixel areas PA1', PA2', and PA3', configurations of the display device according to an exemplary embodiment of the present inventive concept are substantially the same as the configuration of the display device DD described above. Therefore, the shape and arrangement of the pixel areas PA1', PA2', and PA3' will be mainly described below with reference to FIG. 14.

Referring to FIG. 14, when viewed on a plane, the display panel DP' may include a plurality of pixel areas PA1', PA2', and PA3', and a non-pixel area NPA' around each of the pixel areas PA1', PA2', and PA3'. The pixel areas PA1', PA2', and PA3' may have a rectangular shape. However, the present inventive concept is not limited thereto. For example, each of the pixel areas PA1', PA2', and PA3' may have a square shape.

The pixel areas PA1', PA2', and PA3' may include a plurality of first pixel areas PA1' displaying red, a plurality of second pixel areas PA2' displaying green, and a plurality of third pixel areas PA3' displaying blue. The first and second pixel areas PA1' and PA2' may be alternately disposed in the first direction DR.

The third pixel areas PA3' may be disposed between two columns of the first and second pixel areas PA1' and PA2' arranged in the first direction DR1, and the third pixel areas PA3' may be arranged in the first direction DR1. The third pixel areas PA3' may have a rectangular shape extending longer in the first direction DR1.

The display panel DP' may include a pixel defining film PDL' and a plurality of spacers SPC'. First opening parts OP1' overlapping the pixel areas PA1', PA2', and PAY may be formed in the pixel defining film PDL'. The pixel areas PA1', PA2', and PA3' may be provided by the first opening parts OP'.

A second opening part OP2' overlapping the non-pixel area NPA' and extending along the pixel areas PA1', PA2', and PA3' may be formed in the pixel defining film PDL'. The pixel defining film PDL' may include a plurality of first pixel defining films PDL' separated from each other by the second opening part OP2' and surrounding the pixel areas PA1', PA2', and PA3'. In addition, the pixel defining film PDL' may include a plurality of protruding parts PRT' protruding from the first pixel defining films PDL1'. Each of the protruding parts PRT' may protrude from a portion of each of the first pixel defining films PDL1'.

Spacers SPC' may be disposed in predetermined portions of the second opening part OP2'. The spacers SPC' may be spaced apart from the pixel areas PA1', PA2', and PA3' and have, for example, a rectangular shape.

In the display device according to an exemplary embodiment of the present inventive concept, the touch sensitivity of the input sensing part may be increased by reducing the capacitance of the parasitic capacitors between the sensor parts and the pixels.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display device comprising:
    a substrate including a plurality of pixel areas and a non-pixel area at least partially surrounding each of the pixel areas;
    an element layer disposed on the substrate;
    a pixel defining film disposed on the element layer, wherein the pixel defining film includes first openings and a second opening, wherein the first openings overlap the plurality of pixel areas, and the second opening overlaps the non-pixel area and extends along the plurality of pixel areas;
    a plurality of light emitting elements disposed in the first openings;
    a sealing layer disposed on the element layer to cover the light emitting elements and the pixel defining film;
    an input sensing part overlapping the second opening and disposed on the sealing layer, and
    a plurality of spacers disposed in portions of the second opening,
    wherein the pixel defining film comprises:
    a plurality of first pixel defining films separated from each other by the second opening and surrounding the pixel areas; and
    a plurality of second pixel defining films disposed in the second opening and spaced apart from the plurality of first pixel defining films, and
    wherein the plurality of second pixel defining films are disposed between the spacers and the element layer.

2. The display device of claim 1, wherein the pixel areas are arranged in a first direction and a second direction crossing the first direction,
    wherein the second opening extends in the first direction and the second direction.

3. The display device of claim 1, wherein the pixel defining film further comprises:
    a plurality of protruding parts protruding from the plurality of first pixel defining films.

4. The display device of claim 3, wherein the element layer comprises:
    a plurality of transistors disposed on the non-pixel area; and
    an insulating layer disposed on the substrate to cover the transistors,
    wherein the light emitting elements are connected to the plurality of transistors through contact holes formed in the insulating layer.

5. The display device of claim 4, wherein the plurality of protruding parts of the pixel defining film protrude toward the plurality of transistors.

6. The display device of claim 4, wherein each of the light emitting elements comprises:
    a first electrode disposed on the element layer and connected to a corresponding transistor, of the plurality of transistors, through a corresponding contact hole among the contact holes;
    a second electrode disposed on the first electrode; and a light emitting layer disposed between the first electrode and the second electrode.

7. The display device of claim 6, wherein the first electrode comprises:
a first portion disposed in a corresponding first opening of the first openings; and
a second portion extending from the first portion and overlapping a corresponding protruding part among the plurality of protruding parts of the pixel defining film.

8. The display device of claim 7, wherein the corresponding protruding part is disposed on the element layer to cover the second portion of the first electrode.

9. The display device of claim 7, wherein the second portion is connected to the corresponding transistor through the corresponding contact hole.

10. The display device of claim 1, wherein a dielectric constant of an organic layer of the sealing layer is lower than that of the pixel defining film.

11. The display device of claim 1, wherein the pixel defining film has a black color.

12. The display device of claim 1, wherein the input sensing part comprises:
a plurality of first sensor parts having a mesh shape and arranged in a first direction;
a plurality of first connection parts connecting the plurality of first sensor parts to each other;
a plurality of second sensor parts having the mesh shape and arranged in a second direction crossing the first direction; and
a plurality of second connection parts connecting the plurality of second sensor parts to each other;
wherein the plurality of first sensor parts and the plurality of second sensor parts are alternately arranged and are spaced apart from each other, and the plurality of second sensor parts extend to cross the plurality of first sensor parts, wherein the plurality of second sensor parts is insulated from the plurality of first sensor parts.

13. The display device of claim 12, wherein each of the first and second sensor parts comprises:
a plurality of first branch parts extending in a third direction crossing the first and second directions on the plane; and
a plurality of second branch parts extending in a fourth direction crossing the third direction,
wherein the mesh shape is formed by the plurality of first branch parts and the plurality of second branch parts.

14. The display device of claim 13, wherein touch opening parts are formed by the plurality of first branch parts and the plurality of second branch parts and overlap the pixel areas, and the plurality of first branch parts and the plurality of second branch parts overlap the second opening.

15. A display device comprising:
a substrate including a plurality of pixel areas and a non-pixel area at least partially surrounding each of the pixel areas;
an element layer disposed on the substrate;
a plurality of first pixel defining films overlapping the non-pixel area and disposed on the element layer, wherein the plurality of first pixel defining films are separated from each other, and surround the pixel areas;
a plurality of protruding parts protruding from the plurality of first pixel defining films;
a plurality of light emitting elements disposed in first openings overlapping the pixel areas, wherein the first openings are formed in the first pixel defining films;
a sealing layer disposed on the element layer to cover the plurality of light emitting elements and the plurality of first pixel defining films;
an input sensing part overlapping a second opening formed between the plurality of first pixel defining films and disposed on the sealing layer;
a plurality of second pixel defining films disposed in the second opening and spaced apart from the plurality of first pixel defining films; and
a plurality of spacers disposed in portions of the second opening,
wherein the plurality of second pixel defining films are disposed between the spacers and the element layer.

16. The display device of claim 15, wherein the element layer comprises a plurality of transistors disposed on the non-pixel area and connected to the light emitting elements, wherein each of the light emitting elements comprises:
a first electrode disposed on the element layer and connected to a corresponding transistor of the plurality of transistors;
a second electrode disposed on the first electrode; and
a light emitting layer disposed between the first electrode and the second electrode,
wherein the protruding parts protrude toward the plurality of transistors.

17. The display device of claim 16, wherein the first electrode comprises:
a first portion disposed in a corresponding first opening of the first openings; and
a second portion extending from the first portion and overlapping a corresponding protruding part of the plurality of protruding parts,
wherein the corresponding protruding part is disposed on the element layer to cover the second portion of the first electrode, and the second portion of the first electrode is connected to the corresponding transistor.

18. The display device of claim 15, wherein the input sensing part comprises a plurality of sensor parts,
wherein each of the sensor parts comprises:
a plurality of first branch parts extending in a first direction; and
a plurality of second branch parts extending in a second direction crossing the first direction,
wherein the plurality of first branch parts and the plurality of second branch parts overlap the second opening.

* * * * *